(12) United States Patent
Carlson et al.

(10) Patent No.: US 8,037,116 B2
(45) Date of Patent: *Oct. 11, 2011

(54) METHOD AND SYSTEM FOR OPTIMIZING FLOATING POINT CONVERSION BETWEEN DIFFERENT BASES

(75) Inventors: Trevor E. Carlson, Poughkeepsie, NY (US); Ali Y. Duale, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1177 days.

This patent is subject to a terminal disclaimer.

(21) Appl. No.: 11/751,084

(22) Filed: May 21, 2007

(65) Prior Publication Data

US 2008/0263120 A1 Oct. 23, 2008

Related U.S. Application Data

(62) Division of application No. 11/736,090, filed on Apr. 17, 2007, now Pat. No. 7,991,811.

(51) Int. Cl.
*G06F 5/00* (2006.01)

(52) U.S. Cl. ...................................................... 708/204

(58) Field of Classification Search .................. None
See application file for complete search history.

(56) References Cited

U.S. PATENT DOCUMENTS

| | | | |
|---|---|---|---|
| 4,590,584 A * | 5/1986 | Yaguchi et al. | ............... 708/503 |
| 5,889,980 A | 3/1999 | Smith, Jr. | |
| 6,282,554 B1 | 8/2001 | Abdallah et al. | |
| 6,754,810 B2 | 6/2004 | Elliott et al. | |
| 6,990,505 B2 | 1/2006 | Ahmed | |
| 7,707,233 B2 | 4/2010 | Cornea-Hasegan | |
| 2006/0047733 A1 | 3/2006 | Hervin et al. | |
| 2006/0047739 A1 | 3/2006 | Schulte et al. | |
| 2006/0064454 A1 | 3/2006 | Wang et al. | |
| 2006/0179098 A1 | 8/2006 | Kelley et al. | |
| 2006/0179099 A1 | 8/2006 | Carlough et al. | |
| 2006/0179103 A1 | 8/2006 | Carlough et al. | |

(Continued)

OTHER PUBLICATIONS

E.M. Shwarz et al; "The S/390 G5 Floating-point unit;" [online]; [retrieved on Apr. 4, 2007]; retrieved from the internet http://www.research.ibm.com/journal/rd/435/schwarz.html.

(Continued)

*Primary Examiner* — David H Malzahn (74) *Attorney, Agent, or Firm* — Cantor Colburn LLP; Steven Chiu (57) ABSTRACT

A method of streamlining floating-point conversions includes determining a source coefficient and a source exponent of an input value represented by a floating-point number in a source base; estimating an approximated target exponent (ATE) using the source coefficient and the source exponent, in the event the source coefficient has a non-zero value; determining whether the ATE exceeds a maximum exponent so as to result an overflow, and outputting a predefined overflow value in the event of an overflow; determining whether the ATE exceeds a minimum exponent so as to result an underflow, and outputting a predefined underflow value in the event of an underflow; and in the event the ATE does not result in either an overflow or underflow, converting the input value to an output value represented by a converted coefficient, a converted base and the exponent of the output value.

22 Claims, 4 Drawing Sheets

U.S. PATENT DOCUMENTS

| | | |
|---|---|---|
| 2006/0265443 A1 | 11/2006 | Cornea-Hasegan |
| 2007/0022152 A1 | 1/2007 | Gerwig et al. |
| 2007/0050436 A1 | 3/2007 | Chen et al. |
| 2007/0061387 A1 | 3/2007 | Carlough et al. |
| 2007/0061388 A1 | 3/2007 | Carlough et al. |
| 2008/0263120 A1 | 10/2008 | Carlson et al. |

OTHER PUBLICATIONS

Marius Cornea et al., "IEEE 754R Decimal Floating-Point Arithmetic: Reliable and Efficient Implementation for Intel Architecture Platforms," [Online]; [retrieved on Apr. 4, 2007]; retrieved from the Internet http://developer.intel.com/technology/itiindex.htm.

* cited by examiner

METHOD AND SYSTEM FOR OPTIMIZING FLOATING POINT CONVERSION BETWEEN DIFFERENT BASES

CROSS REFERENCE TO RELATED APPLICATION

This application is a divisional application of U.S. Ser. No. 11/736,090, filed Apr. 17, 2007, the disclosure of which is incorporated by reference herein in its entirety.

BACKGROUND

The present invention relates generally to floating-point number systems and, more particularly, to a method and system for optimizing floating-point conversion between different bases.

The conversion between different types of floating-point number representations presents a great challenge. Certain conversion algorithms between IBM's Hexadecimal Floating Point (HFP) and the IEEE 754 Binary Floating Point (BFP) have already been implemented. However, the IEEE 754 floating-point standard has been revised to incorporate a Decimal Floating Point (DFP) definition. DFP provides a wide range of flexibility and advantages over BFP and HFP. For example, decimal arithmetic makes numerical calculations more "human-friendly," providing a robust, reliable framework for financial applications that are often subject to legal requirements concerning rounding and precision of the results in the areas of banking, telephone billing, tax calculation, currency conversion, insurance, or accounting in general.

DFP has been used in calculators for many years, but for the first time it is becoming part of the revised IEEE 754R standard. The DFP formats, as defined by the IEEE 754R standard, include a 32 bit single precision format, a 64 bit double precision format, and a 128 bit extended precision format. This new standard provides the means for computer designers to develop specific operations that are optimized to this new standard. Prior to the standardization of the operands, it was not possible to develop specific operations to accelerate these types of computations. For some commercial workloads, emulation of DFP operations in software can dominate the processing timing.

With the advent of the new standard and the increase in the use of decimal arithmetic operations for financial calculations, it becomes desirable to provide older computing systems with the capability of utilizing the newer DFP format.

SUMMARY

The foregoing discussed drawbacks and deficiencies of the prior art are overcome or alleviated by a method of streamlining floating-point conversions in a digital computing system. In an exemplary embodiment, the method includes determining a source coefficient, $c_1$, and a source exponent, n, of an input value represented by a floating-point number in a source base, $b_1$; estimating an approximated target exponent (ATE) using the source coefficient and the source exponent, in the event the source coefficient has a non-zero value; determining whether the ATE exceeds a predefined maximum exponent so as to result an overflow condition, and outputting a predefined overflow value in the event of an overflow condition; determining whether the ATE exceeds a predefined minimum exponent so as to result an underflow condition, and outputting a predefined underflow value in the event of an underflow condition; and in the event the ATE does not result in either of the overflow and underflow conditions, implementing converting of the input value to an output value represented by $c_2 \times b_2^m$, wherein $c_2$ is a converted coefficient of the output value in a converted base $b_2$ and m is the exponent of the output value.

In another embodiment, a storage medium includes a machine readable computer program code for streamlining floating-point conversions in a digital computing system, and instructions for causing a computer to implement a method. The method further includes determining a source coefficient, $c_1$, and a source exponent, n, of an input value represented by a floating-point number in a source base, $b_1$; estimating an approximated target exponent (ATE) using the source coefficient and the source exponent, in the event the source coefficient has a non-zero value; determining whether the ATE exceeds a predefined maximum exponent so as to result an overflow condition, and outputting a predefined overflow value in the event of an overflow condition; determining whether the ATE exceeds a predefined minimum exponent so as to result an underflow condition, and outputting a predefined underflow value in the event of an underflow condition; and in the event the ATE does not result in either of the overflow and underflow conditions, implementing converting of the input value to an output value represented by $c_2 \times b_2^m$, wherein $c_2$ is a converted coefficient of the output value in a converted base $b_2$ and m is the exponent of the output value.

In another embodiment, a computing apparatus includes a processing unit in communication with one or more memory elements, the processing unit configured to implement a method of streamlining floating-point conversions. The method further includes determining a source coefficient, $c_1$, and a source exponent, n, of an input value represented by a floating-point number in a source base, $b_1$; estimating an approximated target exponent (ATE) using the source coefficient and the source exponent, in the event the source coefficient has a non-zero value; determining whether the ATE exceeds a predefined maximum exponent so as to result an overflow condition, and outputting a predefined overflow value in the event of an overflow condition; determining whether the ATE exceeds a predefined minimum exponent so as to result an underflow condition, and outputting a predefined underflow value in the event of an underflow condition; and in the event the ATE does not result in either of the overflow and underflow conditions, implementing converting of the input value to an output value represented by $c_2 \times b_2^m$, wherein $c_2$ is a converted coefficient of the output value in a converted base $b_2$ and m is the exponent of the output value.

BRIEF DESCRIPTION OF THE DRAWINGS

Referring to the exemplary drawings wherein like elements are numbered alike in the several Figures.

DETAILED DESCRIPTION

IBM has recently introduced a proprietary function, referred to as "Perform Floating Point Operations (PFPO)" that enables the conversion between all three types of floating-point representations. Although the conversion between HFP and BFP is relatively straightforward, the conversion between DFP, and either HFP or BFP is more complex. The main reason is that although both HFP and BFP have similar bases (base 16 and base 2, respectively, wherein base 16 can be represented as base 2), the DFP numbers use base 10. Therefore, the conversion from or to DFP requires converting numbers (which can be thousands of digits) with different bases. In addition, in certain cases, the PFPO function allows the conversion between floating-point number types even if the results cause underflows or overflows.

Accordingly, disclosed herein is a method and system for performing floating-point conversions among the three different floating-point representations in a machine independent manner, which provides improvements in the overall performance of the conversions between these representations. Briefly stated, the methodology classifies floating-point numbers depending on their bases. In particular, HFP and BFP are grouped into a single class (also referred to herein as a "common base format"), while DFP is considered another class. By classifying both HFP and BFP as a single class or common base format, the overall conversion process is simplified in that two classes of data are utilized (rather than three). It is expected that this will enable code and maintenance reduction by approximately 25% or more.

In addition, the methodology embodiments herein perform arithmetic on infinitely precise and large (with an unlimited number of digits) numbers in order to compute the conversions between different floating-point numbers. More specifically, an algorithm embodiment allows for the performance of multiplication operations on a subset of input values. In performing a multiplication operation on a large number by using a relatively smaller number, the operations (with arbitrary length and infinitely precise) may thus be optimized. In still a further aspect, estimations of the target results (exponent) are obtained so as to result in performing the long operations only when necessary.

The conversion between different floating-point representations may cause excessive underflow or overflow. For example, a DFP extended number (with up to 34 coefficient digits and an exponent of +/−6176) can easily lead to over/underflow if the number is to be converted to a short precision of HFP (which has a fraction of 6 digits and exponent, or "characteristic" as it is called, of 64). The PFPO, in certain instances, may allow the underflow/overflow to be masked and the result is computed anyway. But, in the cases where the underflow/overflow is not masked, it is beneficial to check if the source number will lead to underflow/overflow. Thus, disclosed herein is a method of checking the source number before it is converted, and determining whether such a conversion will lead to an underflow/overflow condition. In those cases, the conversion is not performed; instead, logarithms and digit counts may be used to perform the estimation.

As further described herein, with each aspect of the present invention embodiments, a performance improvement and/or implementation simplification is realized.

Figure 1:
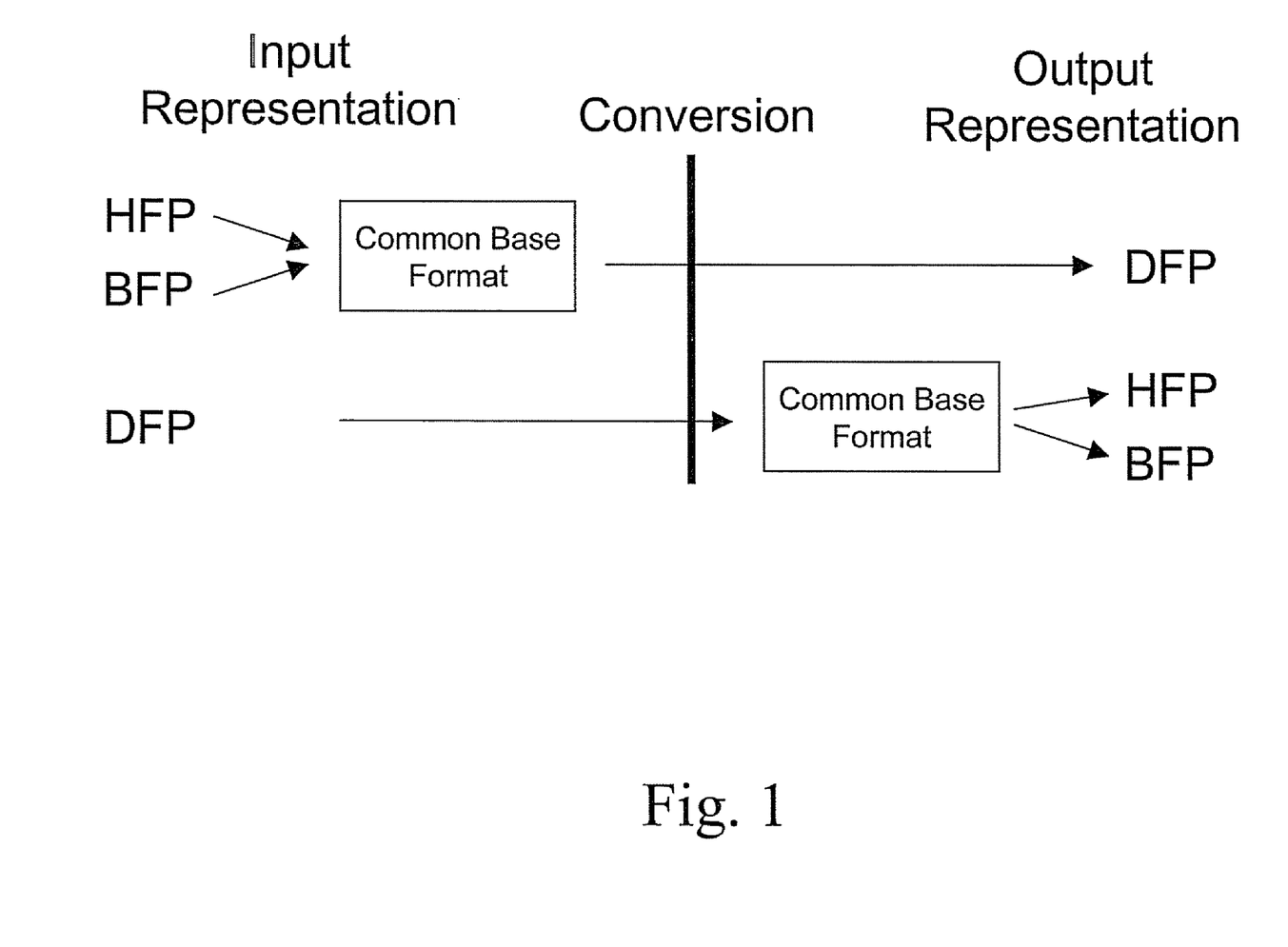
FIG. 1 is a schematic diagram illustrating the use of a common base format in which HFP and BFP are grouped into a single class for DFP conversion purposes, in accordance with an embodiment of the invention.

Referring initially to FIG. 1, there is shown a schematic diagram illustrating the use of a common base format in which HFP and BFP are grouped into a single class for DFP conversion purposes, in accordance with an embodiment of the invention. As indicated before, both BFP fractions and exponents may be easily converted to HFP coefficients and exponents through simple multiplication and shift operations. However, where the target output representation is DFP (with either HFP or BFP as input representations), the source operands are configured into a common base format by using the higher base (which in this case is base 16). In other words, the inputs to a DFP conversion are treated as HFP inputs. On the other hand, when the input representation is DFP and the target output representation is either BFP or HFP, both the coefficients and exponents are treated as common coefficients and exponents.

Figure 2:
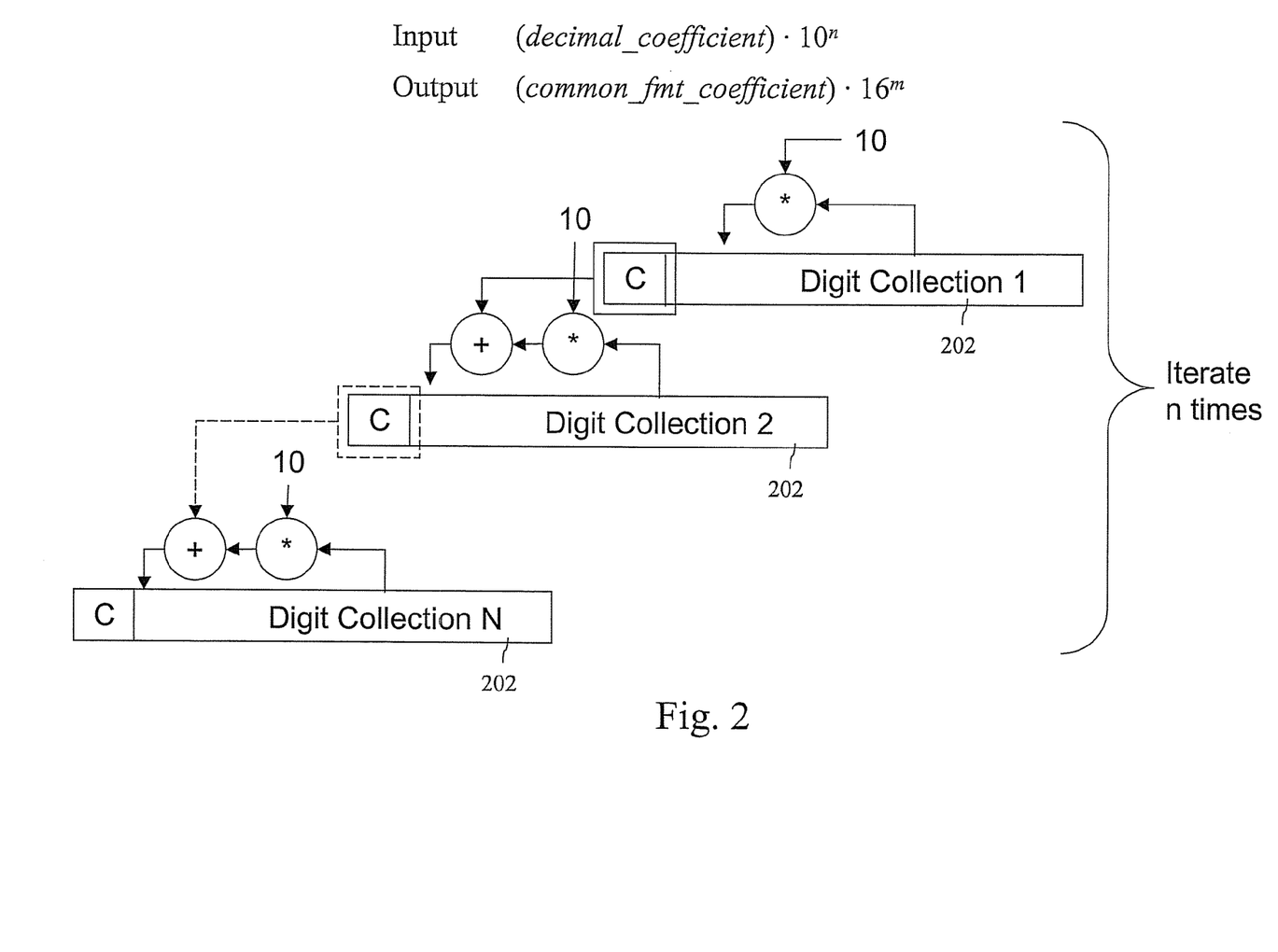
FIG. 2 is a schematic diagram illustrating a method of conversion between different floating-point number representations, in accordance with a further embodiment of the invention.

FIG. 2 is a schematic diagram illustrating a method of conversion between different floating-point number representations, in accordance with a further embodiment of the invention. In the example illustrated, specialized arithmetic operations are used in converting DFP to BFP, wherein the DFP number is viewed as a fixed point number (with no exponent and base). In general for a DFP to BFP/HFP conversion, the coefficient is ideally multiplied by 10, "n" number of times (wherein n is the exponent of the decimal number). The result is then converted to the target format (HFP or BFP). However, converting a large number with thousands of digits (e.g., more than 6000 for an input DFP number) to a different target is not easy. Accordingly, the methodology herein converts the DFP coefficient to a common BFP/HFP format and then performs multiplications by using specialized multipliers on the converted coefficient. The result is the original number converted to the target format.

In particular, FIG. 2 illustrates an example in which DFP is converted to HFP or BFP. In a conversion process (from for example, base 10 to base 16 numbers), the input coefficient to the destination base format (Common Base Format) is followed by iterative multiplications of the coefficient and the source base (in this example, base 10) raised to the power of the source exponent value. Accordingly, FIG. 2 illustrates an iterative process of converting a DFP number, $c_1 \times 10^n$, to an HFP/BFP number, $c_2 \times 16^m$, wherein $c_1$ and $c_2$ are coefficients, and n and m are exponents. A plurality of digit collections 202 (e.g., Digit Collection 1, Digit Collection 2, . . . , Digit Collection N) is used to store an intermediate value (Hex, in this example) following iterative multiplications of the originally converted decimal coefficient.

Once a most significant bit or bits "C" in a given digit collection has a non-zero value, it is stripped from that collection and carried over to the next digit collection (e.g., from Digit Collection 1 to Digit Collection 2). Depending on the value of the multiplicand of the iteration, the size of the C, or carry out, will vary. When multiplying by 10, for example, an overflow maximum of 4 bits may be reserved for the carry section. However, it will be understood that this carry interface may be generalized, depending on the values needed to be multiplied. Stated another way, each Digit Collection 202 represents a set of numbers where the maximum value in the least significant portion of the number multiplied by an external value (10 in the previous example) can only lead to a carry in the upper portion of the array. Because the destination format is the native format of the machine (in this case, the common base format), it is relatively easy to strip the most significant bits from a Digit Collection and then add it into the next one.

It will further be noted that during iterative multiplication, there could be a point where leftmost coefficient digits in a digit collection become zeros. In that case, the multiplications are not performed on those digit collections, which thereby shortens the run time.

This process is estimated to provide a space savings of about 43% when compared to a general purpose arbitrary length integer representation when using the example multiplication factor. Also, by using a larger percentage of the register's space to hold the coefficient, the number of multiplications needed is reduced by this same percentage, and therefore the computation time needed.

It will be appreciated that although the above described conversion technique is presented in the context of a floating-point conversion application, the iterative technique is equally applicable to other functions, such as arbitrary length multiplication operations in general.

Due to the disparity in ranges covered by different floating representations, most of the floating-point number conversions such as DFP to HFP will lead to overflow or underflow. However, depending on the input conditions, the PFPO function enables the ability to represent the converted results even when overflow or underflow occurs. Previously, a conversion is first performed, followed by a determination of whether overflow/underflow in fact occurred. The result is then checked to see whether it is represented as a conventional under/overflow (where the results are usually zeros or a predetermined maximum value of the target). When conventional under/overflow is enabled, the present method embodiments determine if the conversion will lead to under/overflow. The method performs a close approximation of the converted results and continues with the complete conversion only when the result is not causing under/overflow.

Figure 3:
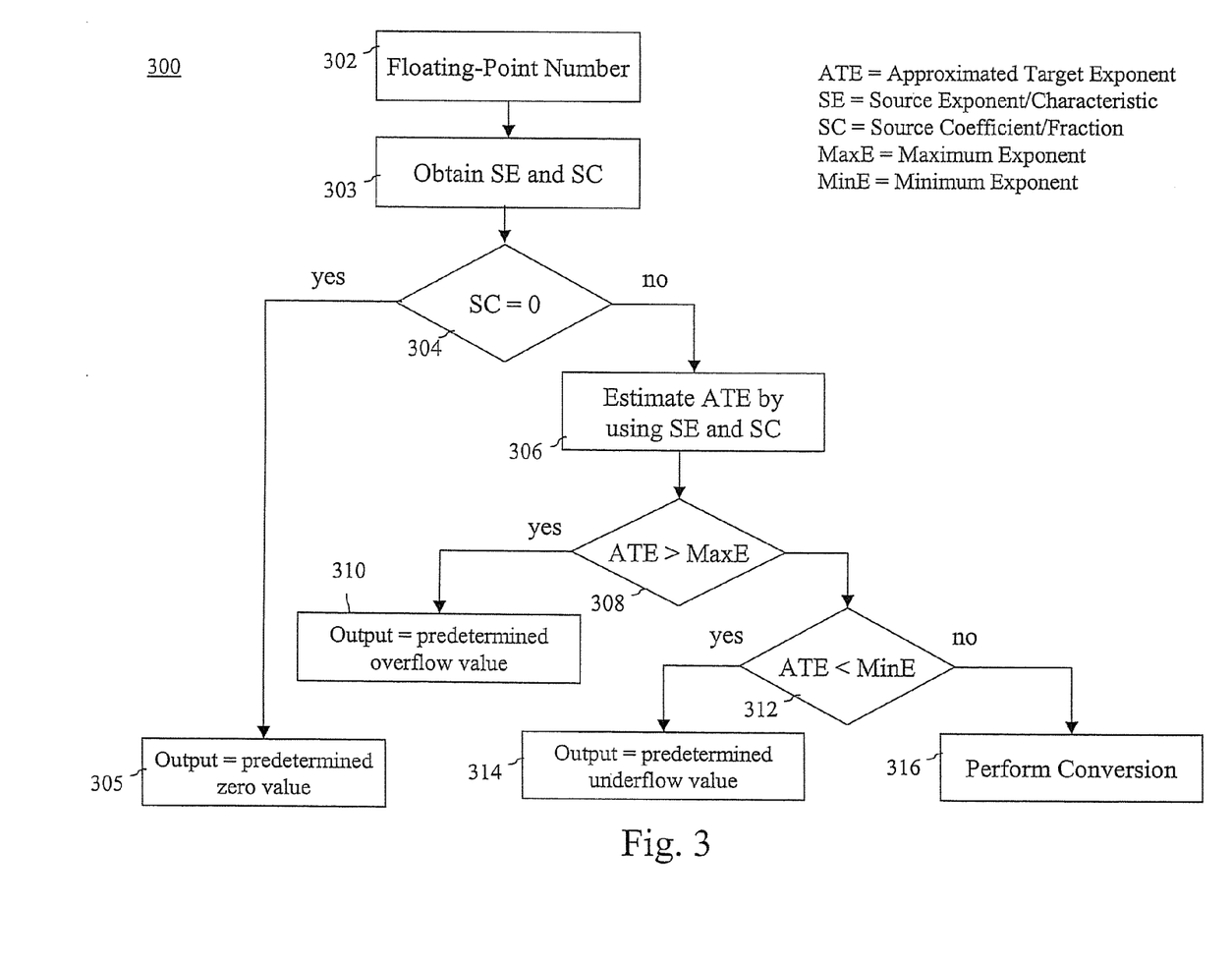
FIG. 3 is a flow diagram illustrating a method of checking a source number before conversion, and determining whether such a conversion will lead to an underflow/overflow condition in accordance with a further embodiment of the invention.

As more specifically illustrated in the flow diagram 300 of FIG. 3, a floating-point number to be converted is obtained, as shown in block 302. In block 303, the exponent of the floating-point number is then obtained, assuming a non-zero source coefficient/fraction. However, if the source coefficient/fraction is found to be zero at decision block 304, then the output is set to a predetermined zero value, as reflected in block 305. Otherwise, an approximated target exponent "ATE" is estimated using the source exponent/characteristic "SE" and the non-zero source coefficient/fraction "SC" as shown in block 306. As an example, it is assumed that a number, represented as $c_1 \times b_1^n$, is to be converted to a different floating-point format, $c_2 \times b_2^m$. The ATE may be estimated using the expression: $m + \Delta$;

where $m = n [\ln(b_1)/\ln(b_2)]$ and $\Delta$ is an integer that is equal to, at least the number of digits, in the source coefficient.

If the ATE exceeds the maximum exponent (i.e., an overflow condition) as reflected in decision block 308, the method proceeds to block 310 where the output is set to a predetermined overflow value (e.g., a defined maximum exponent and coefficient for overflow). Similarly, in decision block 312, if the ATE is less than the minimum exponent (i.e., an underflow condition), the method proceeds to block 314 where the output is set to a predetermined underflow value (e.g., a defined minimum exponent and coefficient for underflow). On the other hand, if the ATE does not result in either an overflow or an underflow condition, the method proceeds to block 316 where the conversion is performed as described above.

Figure 4:
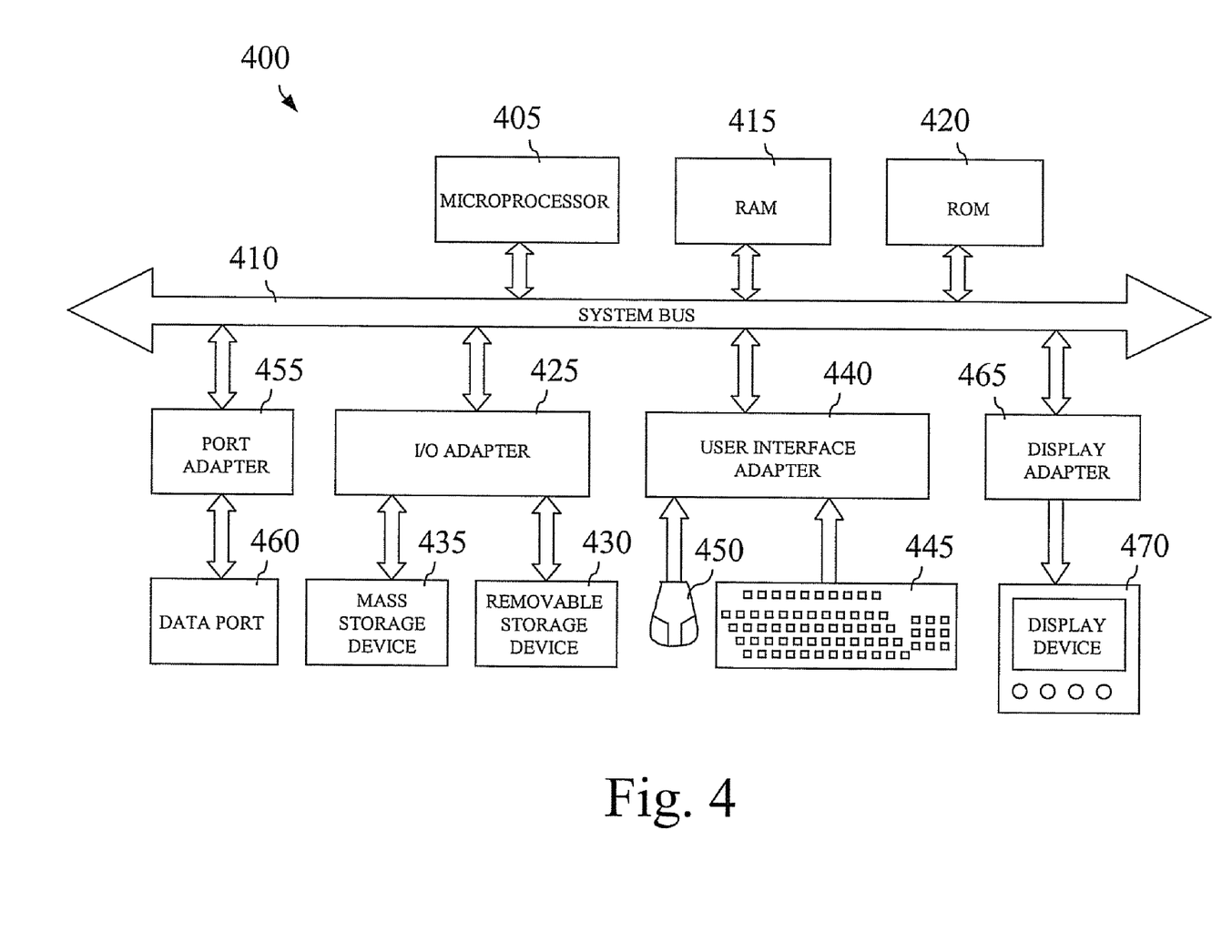
FIG. 4 is a schematic block diagram of a general-purpose computer suitable for practicing the present invention embodiments.

Generally, the method for optimizing floating-point conversion between different bases described herein is practiced with a general-purpose computer and the method may be coded as a set of instructions on removable or hard media for use by the general-purpose computer. FIG. 4 is a schematic block diagram of a general-purpose computer suitable for practicing the present invention embodiments. In FIG. 4, computer system 400 has at least one microprocessor or central processing unit (CPU) 405. CPU 405 is interconnected via a system bus 410 to a random access memory (RAM) 415, a read-only memory (ROM) 420, an input/output (I/O) adapter 425 for a connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470.

ROM 420 contains the basic operating system for computer system 400. The operating system may alternatively reside in RAM 415 or elsewhere as is known in the art. Examples of removable data and/or program storage device 430 include magnetic media such as floppy drives and tape drives and optical media such as CD ROM drives. Examples of mass data and/or program storage device 435 include hard disk drives and non-volatile memory such as flash memory. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 430, fed through data port 460 or typed in using keyboard 445.

In view of the above, the present method embodiments may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the exemplary method described above and illustrated in FIGS. 1 through 3.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A computer implemented method of streamlining floating-point conversions in a digital computing system, the method comprising:
   determining, by a processing unit, a source coefficient, $c_1$, and a source exponent, n, of an input value represented by a floating-point number in a source base, $b_1$;
   estimating an approximated target exponent (ATE) using the source coefficient and the source exponent, responsive to the source coefficient having a non-zero value;
   determining whether the ATE exceeds a predefined maximum exponent wherein the ATE exceeding the predefined maximum exponent is an overflow condition, and outputting a predefined overflow value responsive to determining the overflow condition;
   responsive to determining the ATE does not exceed the predefined maximum exponent, determining whether the ATE is less than a predefined minimum exponent wherein the ATE being less than the predefined minimum exponent is an underflow condition, and outputting a predefined underflow value responsive to determining the underflow condition; and
   responsive to the ATE not exceeding the predefined maximum value and the ATE not being less than the predefined minimum value, converting the input value to an output value represented by $c_2 \times b_2^m$, wherein $c_2$ is a converted coefficient of the output value in a converted base $b_2$ and m is an exponent of the output value.

2. The computer implemented method of claim 1, wherein the converted base $b_2$ is hexadecimal.

3. The computer implemented method of claim 2, wherein the source base $b_1$ is decimal.

4. The computer implemented method of claim 1, wherein the converted base $b_2$ is used to represent both Hexadecimal Floating Point (HFP) and Binary Floating Point (BFP) formats.

5. The computer implemented method of claim 1, wherein the source exponent is positive.

6. A computer program product comprising a tangible storage medium, having computer readable instructions stored thereon that, when executed by a computer, perform a method of streamlining floating-point conversions in a digital computing system, wherein the method comprises:
   determining a source coefficient, $c_1$, and a source exponent, n, of an input value represented by a floating-point number in a source base, $b_1$;
   estimating an approximated target exponent (ATE) using the source coefficient and the source exponent, responsive to the source coefficient having a non-zero value;
   determining whether the ATE exceeds a predefined maximum exponent so wherein the ATE exceeding the predefined maximum exponent is an overflow condition, and outputting a predefined overflow value responsive to determining the overflow condition;
   responsive to determining the ATE does not exceed the predefined maximum exponent, determining whether the ATE is less than a predefined minimum exponent wherein the ATE being less than the predefined minimum exponent is an underflow condition, and outputting a predefined underflow value responsive to determining the underflow condition; and
   responsive to the ATE not exceeding the predefined maximum value and the ATE not being less than the predefined minimum value, converting the input value to an output value represented by $c_2 \times b_2^m$, wherein $c_2$ is a converted coefficient of the output value in a converted base $b_2$ and m is an exponent of the output value.

7. The computer program product of claim 6, wherein the converted base $b_2$ is hexadecimal.

8. The computer program product of claim 7, wherein the source base $b_1$ is decimal.

9. The computer program product of claim 6, wherein the converted base $b_2$ is used to represent both Hexadecimal Floating Point (HFP) and Binary Floating Point (BFP) formats.

10. The computer program product of claim 6, wherein the source exponent is positive.

11. A computing apparatus, comprising:
    a processing unit in communication with one or more memory elements, the processing unit configured to implement a method of streamlining floating-point conversions, the method comprising:
      determining a source coefficient, $c_1$, and a source exponent, n, of an input value represented by a floating-point number in a source base, $b_1$;
      estimating an approximated target exponent (ATE) using the source coefficient and the source exponent, responsive to the source coefficient having a non-zero value;
      determining whether the ATE exceeds a predefined maximum exponent wherein the ATE exceeding the predefined maximum exponent is an overflow condition, and outputting a predefined overflow value in the event of an overflow condition;
      responsive to determining the ATE does not exceed the predefined maximum exponent, determining whether the ATE is less than a predefined minimum exponent wherein the ATE being less than the predefined minimum exponent is an underflow condition, and outputting a predefined underflow value responsive to determining the underflow condition; and
      responsive to the ATE not exceeding the predefined maximum exponent and the ATE not being less than the predefined minimum exponent, converting the input value to an output value represented by $c_2 \times b_2^m$, wherein $c_2$ is a converted coefficient of the output value in a converted base $b_2$ and m is an exponent of the output value.

12. The apparatus of claim 11, wherein the converted base $b_2$ is hexadecimal.

13. The apparatus of claim 12, wherein the source base $b_1$ is decimal.

14. The apparatus of claim 11, wherein the converted base $b_2$ is used to represent both Hexadecimal Floating Point (HFP) and Binary Floating Point (BFP) formats.

15. The apparatus of claim 11, wherein the source exponent is positive.

16. A method of performing floating-point conversions in a digital computing system, the method comprising:
    determining, by a processing unit, a source coefficient, $c_1$, and a source exponent, n, of an input value represented by a floating-point number in a source base, $b_1$;
    converting the source coefficient to a common base, $c_2$, and storing the converted coefficient in a first digit collection;
    iteratively multiplying the contents of the first digit collection by $b_1$ and storing the intermediate results in the first digit collection, wherein one or more overflow bits of the first digit collection are carried and added to one or more additional digit collections once a nonzero value thereof is reached; and
    wherein an output value in the common base is stored in the digit collections after n multiplication iterations, represented by $c_2 \times b_2^m$, wherein $c_2$ is the converted coefficient of the output value in the common base $b_2$ and m is the exponent of the output value.

17. The computer implemented method of claim 16, wherein the common base $b_2$ is hexadecimal.

18. The computer implemented method of claim 17, wherein the source base $b_1$ is decimal.

19. The computer implemented method of claim 18, wherein the one or more overflow bits comprise up to four bits for a decimal source base.

20. The computer implemented method of claim 16, wherein the common base $b_2$ is used to represent both Hexadecimal Floating Point (HFP) and Binary Floating Point (BFP) formats.

21. The computer implemented method of claim 16, further comprising:
   estimating an approximated target exponent (ATE) using the source coefficient and the source exponent, responsive to the source coefficient having a non-zero value;
   determining whether the ATE exceeds a predefined maximum exponent wherein the ATE exceeding the predefined maximum exponent is an overflow condition, and outputting a predefined overflow value responsive to determining the overflow condition;
   responsive to determining the ATE does not exceed the predefined maximum exponent, determining whether the ATE is less than a predefined minimum exponent wherein the ATE being less than the predefined minimum exponent is an underflow condition, and outputting a predefined underflow value responsive to determining the underflow condition; and
   responsive to the ATE not exceeding the predefined maximum value and the ATE not being less than the predefined minimum value, performing the converting and the iteratively multiplying.

22. The computer implemented method of claim 21, wherein the source exponent is positive.

* * * * *